(12) United States Patent
Elgaard et al.

(10) Patent No.: US 12,283,925 B2
(45) Date of Patent: Apr. 22, 2025

(54) BIAS CIRCUIT AND POWER AMPLIFIER CIRCUIT

(71) Applicant: Telefonaktiebolaget LM Ericsson (publ), Stockholm (SE)

(72) Inventors: Christian Elgaard, Lund (SE); Henrik Sjöland, Lund (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 0 days.

(21) Appl. No.: 18/635,728

(22) Filed: Apr. 15, 2024

(65) Prior Publication Data

US 2024/0267011 A1  Aug. 8, 2024

Related U.S. Application Data

(63) Continuation of application No. 17/421,289, filed as application No. PCT/EP2019/073046 on Aug. 29, 2019, now Pat. No. 11,990,875.

(60) Provisional application No. 62/790,767, filed on Jan. 10, 2019.

(51) Int. Cl.
*H03F 3/24* (2006.01)
(52) U.S. Cl.
CPC ....... *H03F 3/245* (2013.01); *H03F 2200/451* (2013.01)
(58) Field of Classification Search
CPC ....................................................... H03F 3/25
See application file for complete search history.

(56) References Cited

U.S. PATENT DOCUMENTS

| 4,225,897 | A  | 9/1980  | Kaplan    |
|-----------|----|---------|-----------|
| 5,023,937 | A  | 6/1991  | Opas      |
| 5,699,383 | A  | 12/1997 | Ichiyoshi |
| 6,201,446 | B1 | 3/2001  | Ananth    |
| 7,443,237 | B1 | 10/2008 | Liu       |

(Continued)

FOREIGN PATENT DOCUMENTS

| CN | 202931370 U | 5/2013 |
|----|-------------|--------|
| CN | 104868905 A | 8/2015 |
| EP | 1011192 A2  | 6/2000 |

OTHER PUBLICATIONS

Office Action dated Jun. 4, 2024 for U.S. Appl. No. 18/003,026, consisting of 14 pages.

(Continued)

*Primary Examiner* — Patricia T Nguyen
(74) *Attorney, Agent, or Firm* — Weisberg I.P. Law, P.A.

(57) ABSTRACT

A bias circuit for a PA. A first transistor has its drain terminal and its gate terminal connected to a first circuit node and its source terminal connected to a first supply terminal, a first current source connected to the first circuit node, and a first resistor connected between the first and second circuit nodes. A second transistor receives a first component of a differential input signal to the PA at its gate terminal, has its drain terminal connected to the second circuit node and its source terminal connected to a second supply terminal, and a third transistor receives a second component of the differential input signal to the PA at its gate terminal, having its drain terminal connected to the second circuit node and its source terminal connected to a second supply terminal. The gates terminals of the second and third transistors are biased by a first voltage.

23 Claims, 4 Drawing Sheets

(56) References Cited

U.S. PATENT DOCUMENTS

| | | | |
|---|---|---|---|
| 8,295,877 B2 | 10/2012 | Hui et al. | |
| 9,300,253 B2* | 3/2016 | Hasegawa | H03F 1/0266 |
| 10,819,303 B1* | 10/2020 | Park | H03G 5/28 |
| 2002/0130646 A1 | 9/2002 | Zadeh et al. | |
| 2006/0229036 A1 | 10/2006 | Muller et al. | |
| 2008/0186101 A1 | 8/2008 | Arakali et al. | |
| 2010/0109779 A1 | 5/2010 | Pham et al. | |
| 2010/0176869 A1* | 7/2010 | Horie | H03F 1/302 |
| | | | 327/513 |
| 2010/0283894 A1 | 11/2010 | Horan et al. | |
| 2013/0106513 A1 | 5/2013 | Cyrusian et al. | |
| 2014/0340149 A1* | 11/2014 | Johnson | H03F 3/45089 |
| | | | 330/257 |
| 2015/0130540 A1 | 5/2015 | Hasegawa | |
| 2015/0200635 A1 | 7/2015 | Wang et al. | |
| 2015/0280660 A1 | 10/2015 | Azin et al. | |
| 2016/0085250 A1* | 3/2016 | Luo | G05F 1/468 |
| | | | 323/281 |
| 2018/0159567 A1 | 6/2018 | Matsuura et al. | |
| 2019/0190472 A1 | 6/2019 | Snoeij et al. | |
| 2019/0258283 A1* | 8/2019 | Pishdad | G05F 1/575 |
| 2021/0281219 A1 | 9/2021 | Khlat | |
| 2022/0416737 A1* | 12/2022 | Goldblatt | H03F 3/191 |

OTHER PUBLICATIONS

International Search Report and Written Opinion dated Dec. 2, 2019 for International Application No. PCT/EP2019/073046 filed Aug. 29, 2019, consisting of 13-pages.

Shouhei Kousai et al.; A 28.3mw PA-Closed Loop for Linearity and Efficiency Improvement Integrated in a $+$ 27.1 dBm WCDMA CMOS Power Amplifier; IEEE Journal of Solid-State Circuits, vol. 47, Issue: 12, Dec. 1, 2012, consisting of 10-pages.

Jenny Yi-Chun Liu et al.; Millimeter-Wave Self-Healing Power Amplifier with Adaptive Amplitude and Phase Linearization in 65-nm CMOS; IEEE Transactions on Microwave Theory and Techniques; vol. 60, Issue: 5, May 1, 2012, consisting of 11-pages.

Weng Shih-Min et al.; A 60-GHz Adaptively Biased Power Amplifier with Predistortion Linearizer in 90-nm CMOS; 2018 IEEE/MTT-S International Microwave Symposium, Jun. 10, 2018, consisting of 4-pages.

Christian Elgaard et al.; A 27 GHz Adaptive Bias Variable Gain Power Amplifier ans T/R Switch in 22nm FD-SOI CMOS for 5G Antenna Arrays; 2019 IEEE Radio Frequency Integrated Circuits Symposium (RFIC), 2019, consisting of 4-pages.

Pang, Jian et al., A 28GHz CMOS Phased-Array Transceiver Featuring Gain Invariance Based on LO Phase Shifting Architecture with 0.1-Degree Beam-Steering Resolution for 5G New Radio; IEEE Radio Frequency Integrated Circuits Symposium, 2018, consisting of 4 pages.

International Search Report and Written Opinion dated Mar. 16, 2021 for International Application No. PCT/EP2020/067335 filed on Jun. 22, 2020, consisting of 11 pages.

Chinese Office Action and English summary dated Oct. 10, 2023 for Application No. 201980088536.4, consisting of 11 pages.

International Search Report and Written Opinion dated Nov. 18, 2024 for International Application No. PCT/EP2024/061614 filed Apr. 26, 2024, consisting of 21 pages.

Milovanovic et al. "Analyses of Single-Stage Complementary Self-Biased CMOS Differential Amplifiers"; Vienna University of Technology, Austria; 2012, consisting of 4 pages.

Milovanovic et al. "On Fully Differential and Complementary Single-Stage Self Biased CMOS Differential Amplifiers"; Vienna University of Technology, Austria; 2013, consiting of 9 pages.

* cited by examiner

BIAS CIRCUIT AND POWER AMPLIFIER CIRCUIT

CROSS-REFERENCE TO RELATED APPLICATIONS

This application is a Continuation of U.S. application Ser. No. 17/421,289, filed Jul. 7, 2021, which is a National Stage Application of International Application No.: PCT/EP2019/073046, filed Aug. 29, 2019, which claims priority to U.S. Provisional Application No. 62/790,767, filed Jan. 10, 2019, the entireties of all of which are incorporated herein by reference.

TECHNICAL FIELD

The present disclosure relates to a bias circuit for a power amplifier and a power amplifier circuit comprising the bias circuit and a power amplifier.

BACKGROUND

In upcoming millimeter wave fifth generation (5G) communications systems, the efficiency of the power amplifiers in the transmitters is very challenging. The reason is that the frequency and bandwidth are both very high, at the same time as a modulation with high peak-to-average power ratios will be used. Established techniques used to improve the efficiency in lower bandwidth systems are difficult to use due to bandwidth and timing accuracy requirements.

Techniques developed to enhance the efficiency of lower bandwidth systems, like envelope tracking, may have performance issues in 5G millimeter-wave applications.

SUMMARY

It is an object of embodiments of the present disclosure to provide adaptive biasing of power amplifiers.

According to a first aspect, there is provided a bias circuit for a power amplifier (PA). The bias circuit comprises a first transistor having its drain terminal and its gate terminal connected to a first circuit node and its source terminal connected to a first supply terminal. Furthermore, the bias circuit comprises a first current source connected to the first circuit node and a first resistor connected between the first circuit node and a second circuit node. Moreover, the bias circuit comprises a second transistor configured to receive a first component of a differential input signal to the PA at its gate terminal. The second transistor has its drain terminal connected to the second circuit node and its source terminal connected to a second supply terminal. The bias circuit further comprises a third transistor configured to receive a second component of the differential input signal to the PA at its gate terminal. The third transistor has its drain terminal connected to the second circuit node and its source terminal connected to a second supply terminal. The gate terminals of the second transistor and the third transistor are configured to be biased by a first voltage. The bias circuit is configured to generate a bias voltage for the PA at the second circuit node.

The bias voltage for the PA may be a bias voltage for gate terminals of input transistors of the PA.

The first voltage may be digitally controllable.

A resistance of the first resistor may be digitally controllable.

The bias circuit may comprise a first capacitor connected between the first circuit node and the first supply terminal.

The bias circuit may comprise a fourth transistor having its gate terminal connected to a third circuit node, its drain terminal connected to the first circuit node, and its source terminal connected to the first supply terminal.

Furthermore, the bias circuit may comprise a fifth transistor having its drain terminal and its gate terminal connected to the third circuit node and its source terminal connected to the first supply terminal. Moreover, the bias circuit may comprise a sixth transistor configured to receive the first component of a differential input signal to the PA at its gate terminal. The sixth transistor may have its drain terminal connected to the third circuit node and its source terminal connected to the second supply terminal. The bias circuit may also comprise a seventh transistor configured to receive the second component of the differential input signal to the PA at its gate terminal. The seventh transistor may have its drain terminal connected to the third circuit node and its source terminal connected to the second supply terminal.

In some embodiments, the gate terminals of the sixth transistor and the seventh transistor are configured to be biased by the first voltage.

In some embodiments, the second supply terminal is configured to be supplied with a higher electrical potential than the first supply terminal. In such embodiments, the first transistor (and, where applicable, each of the fourth transistor and the fifth transistor) may be an NMOS transistor. Furthermore, in such embodiments, the second transistor and the third transistor (and, where applicable, the sixth transistor and the seventh transistor) may be PMOS transistors.

In some embodiments, the second supply terminal is configured to be supplied with a lower electrical potential than the first supply terminal. In such embodiments, the first transistor (and, where applicable, each of the fourth transistor and the fifth transistor) may be a PMOS transistor. Furthermore, in such embodiments, the second transistor and the third transistor (and, where applicable, the sixth transistor and the seventh transistor) may be NMOS transistors.

According to a second aspect, there is provided a PA circuit. The PA circuit comprises the bias circuit of the first aspect and a PA configured to be biased with said bias voltage.

The PA in the PA circuit may comprise an input stage of common source type. Input transistors of the input stage may be configured to be biased with the bias voltage at their gate terminals.

The PA of the PA circuit may comprise a first transformer configured to receive the input signal of the PA across a primary winding. The transformer may have a secondary winding connected between the gate terminals of the input transistors of the input stage. The transformer may be configured to receive the bias voltage at a center tap of the secondary winding.

According to a third aspect, there is provided an integrated circuit comprising the PA circuit of the second aspect.

According to a fourth aspect, there is provided an electronic apparatus comprising the PA circuit of the second aspect. The electronic apparatus may e.g. be a communication apparatus, such as (but not limited to) a wireless communication device or a base station for a cellular communications system.

DETAILED DESCRIPTION

It should be emphasized that the term "comprises/comprising" when used in this disclosure is taken to specify the presence of stated features, integers, steps, or components, but does not preclude the presence or addition of one or more other features, integers, steps, components, or groups thereof.

Adaptive bias is used in embodiments of the present disclosure to adjust the bias level when the input signal amplitude changes. In a class-A/AB Power amplifier (PA) this may for instance mean to increase the bias current as the input signal amplitude goes up.

Adaptive bias can reduce amplitude to amplitude (AM-AM) distortion, which effectively means an increase in output referred 1 dB compression point (OP1dB) and saturated output power (Psat). It can also be a way to reduce the power consumption when delivering low output power.

Figure 1:
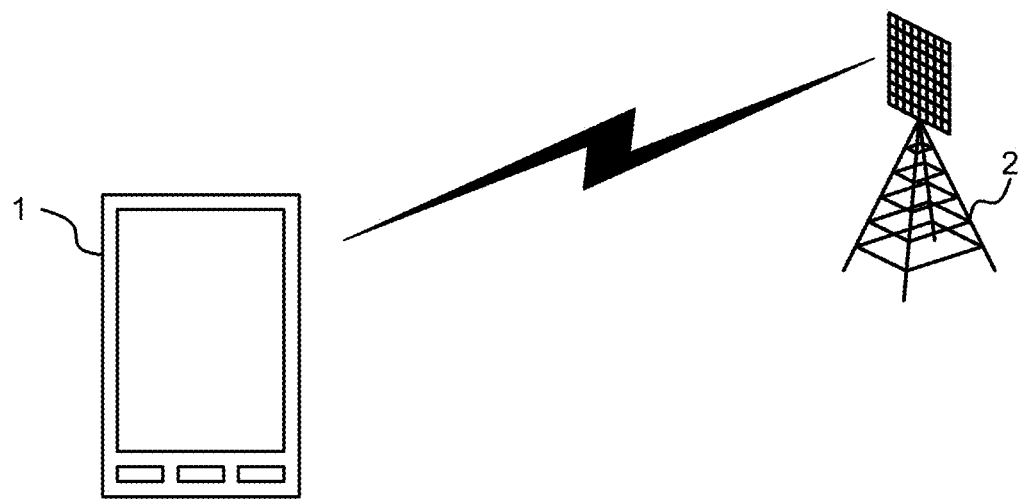
FIG. 1 illustrates a communication environment.

FIG. 1 illustrates a communication environment wherein embodiments of the present disclosure may be employed. A wireless communication device 1, or wireless device 1 for short, of a cellular communications system is in wireless communication with a radio base station 2 of the cellular communications system. The wireless device 1 may 1 may be what is generally referred to as a user equipment (UE). The wireless devices 1 is depicted in FIG. 1 as a mobile phone, but may be any kind of device with cellular communication capabilities, such as a tablet or laptop computer, machine-type communication (MTC) device, or similar. Furthermore, a cellular communications system is used as an example throughout this disclosure. However, embodiments of the present disclosure may be applicable in other types of systems as well, such as but not limited to WiFi systems.

The radio base station 2 and wireless device 1 are examples of what in this disclosure is generically referred to as communication apparatuses. Embodiments are described below in the context of a communication apparatus in the form of the radio base station 2 or wireless device 1. However, other types of communication apparatuses can be considered as well, such as a WiFi access point or WiFi enabled device.

Figure 2:
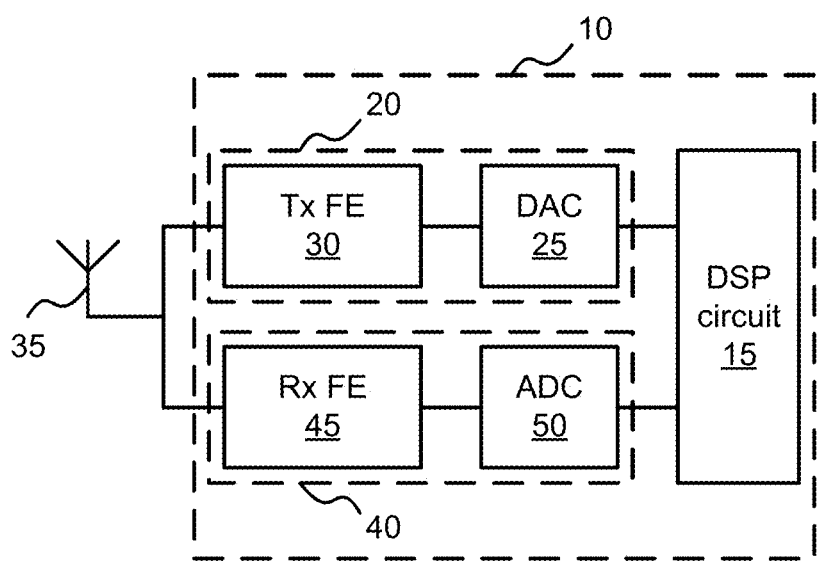
FIG. 2 is a block diagram of an embodiment of a transceiver circuit.

FIG. 2 is a block diagram of an embodiment of a transceiver circuit 10, which can be comprised in a communication apparatus, such as the radio base station 2 or the wireless device 1. In the embodiment illustrated in FIG. 2, the transceiver circuit 10 comprises a digital signal processing (DSP) circuit 15. The DSP circuit 15 may e.g. be what is commonly referred to as baseband processor. The DSP circuit 15 may e.g. be configured to perform various digital signal processing tasks, such as one or more of coding, decoding, modulation, demodulation, fast Fourier transform (FFT), inverse FFT (IFFT), mapping, demapping, etc.

Furthermore, in the embodiment illustrated in FIG. 2, the transceiver circuit 10 comprises a transmitter circuit 20. The transmitter circuit 20 comprises a digital-to-analog converter (DAC) 25. The DAC 25 is connected to the DSP circuit 15 and configured to receive, as an input signal of the DAC 25, a digital representation of a signal to be transmitted from the DSP circuit 15. The DAC 25 is further configured to convert the signal to be transmitted to an analog representation, which is an output signal of the DAC 25. The transmitter circuit 20 also comprises a transmitter (Tx) frontend (FE) circuit 30 connected between the DAC 25 and an antenna 35. The Tx FE circuit 30 is configured to transform the output signal from the DAC 25 to a format suitable for transmission via the antenna 35. This may include operations such as frequency upconversion, filtering, and/or amplification. The Tx FE circuit 30 may comprise one or more mixers, filters, and/or amplifiers. The design of such Tx FE circuits is, per se, well known to a person skilled in the field of radio transceiver design and is not discussed herein in any further detail. The Tx FE circuit 30 typically also comprises a power amplifier (PA) configured to feed the signal to be transmitted into the antenna 35. Embodiments of a bias circuit for such a PA are presented in this disclosure. Furthermore, embodiments of a PA circuit comprising said bias circuit and a PA are also presented in this disclosure.

Moreover, in the embodiment illustrated in FIG. 2, the transceiver circuit 10 comprises a receiver circuit 40. The receiver circuit 40 comprises a receiver (Rx) FE circuit 45 connected to the antenna 35. Furthermore, the receiver circuit 40 comprises an ADC 50. The ADC 50 is connected between the Rx FE circuit 45 and the DSP circuit 15. The Rx FE circuit 45 is configured to transform a signal received via the antenna 35 to a format suitable to be input to the ADC 50. This may include operations such as frequency downconversion, filtering, and/or amplification. The Rx FE circuit 45 may comprise one or more mixers, filters, and/or amplifiers, such as low-noise amplifiers (LNAs), to perform such operations. The design of such Rx FE circuits is, per se, well known to a person skilled in the field of radio transceiver design, and is not discussed herein in any further detail. The ADC 50 is configured to receive its (analog) input signal from the Rx FE circuit, and convert it to a digital representation to generate the digital output signal of the ADC 50. This digital output signal of the ADC 50 is input to the DSP circuit 15 for further digital signal processing.

Figure 3:
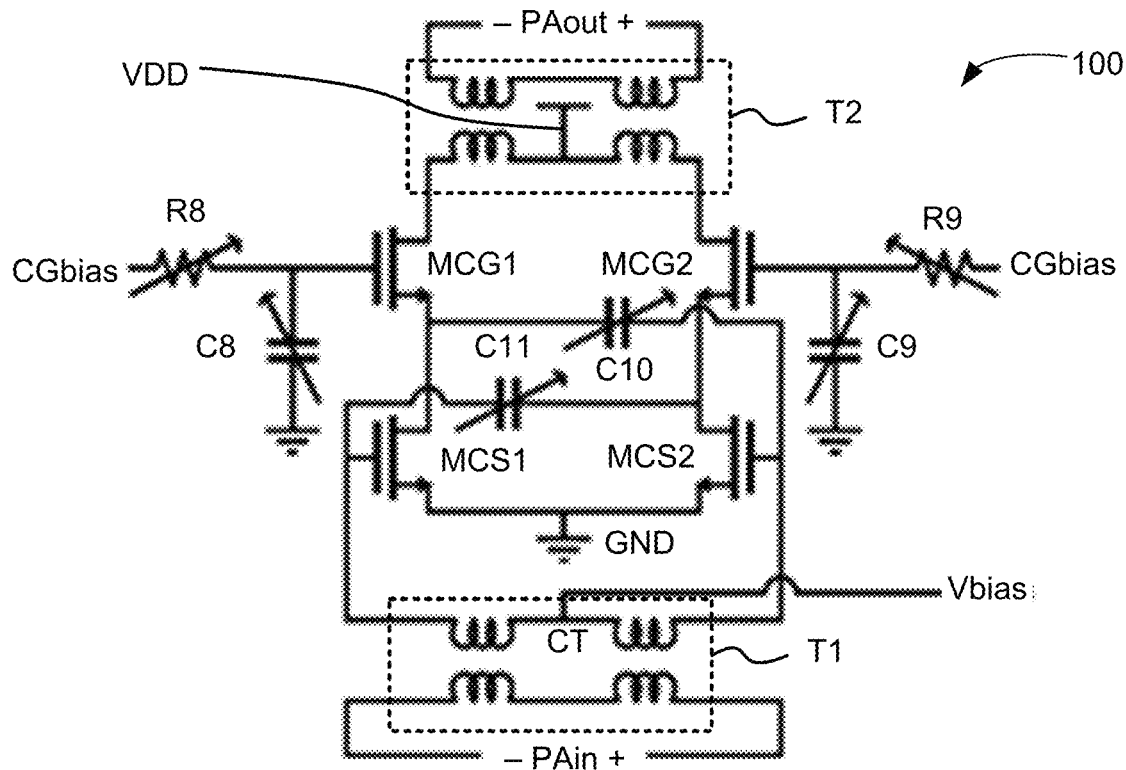
FIG. 3 is a schematic circuit diagram of a power amplifier.

FIG. 3 is a schematic circuit diagram of a PA 100 that can be used in conjunction with embodiments of the above-mentioned bias circuit. It should be noted that the embodiment of the PA 100 illustrated in FIG. 3 is merely an example, and that other types of PAs may be used together with the bias circuit as well.

According to the embodiment illustrated in FIG. 3, the PA 100 comprises an input stage of common source type. Said input stage comprises a differential pair of input transistors MCS1 and MCS2, which are configured to be biased with a bias voltage Vbias at their gate terminals. The bias voltage Vbias may be supplied to the gate terminals of MCS1 and MCS2 in many different ways. In the embodiment illustrated in FIG. 3, the PA 100 comprises a first transformer T1. A secondary winding of the first transformer T1 is connected between the gate terminals of MCS1 and MCS2. The first transformer T1 is configured to receive the bias voltage at a center tap CT of the secondary winding. Furthermore, the first transformer T1 is configured to receive an input signal PAin of the PA 100 across a primary winding. In FIG. 3, the source terminals of MCS1 and MCS2 are connected to a first supply terminal (ground, or "GND").

As illustrated in FIG. 3, the PA 100 may comprise additional transistor stages. For instance, in FIG. 3, the PA 100 comprises a common gate stage connected to the common source input stage. Said common gate stage comprises a differential pair of transistors MCG1 and MCG2. MCG1 and MCG2 acts as cascode transistors for MCS1 and MCS2. In FIG. 3, MCG1 and MCG2 are biased with a bias voltage CGbias at their gate terminals.

As illustrated in FIG. 3, the PA 100 may further comprise a second transformer T2. In FIG. 3, the second transformer T2 has a primary winding connected between the drain terminal of MCG1 and the drain terminal of MCG2. A center tap of the primary winding of D1 is connected to a second supply terminal ("VDD").

Furthermore, In FIG. 3, the second transformer T2 is configured to generate an output PAout of the PA 100 across a secondary winding.

As illustrated in FIG. 3, the PA 100 may comprise further components, such as internal feedback capacitors C10 and C11, capacitors C8 and C9, and resistors R8 and R9.

Figure 4:
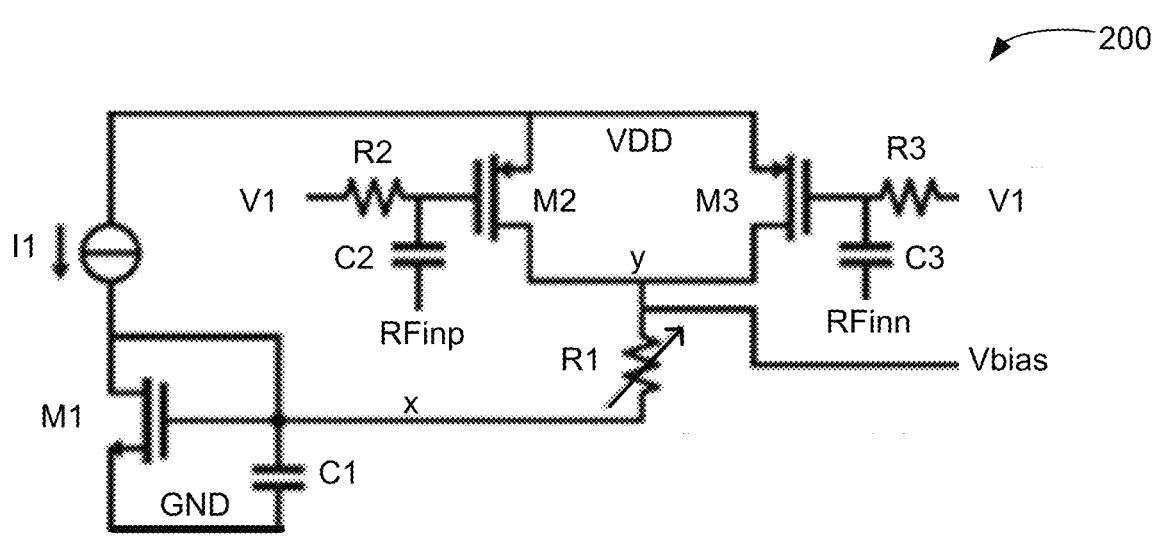
FIG. 4 is a schematic circuit diagram of a bias circuit.

FIG. 4 is a schematic circuit diagram of a bias circuit 200 according to embodiments of the present disclosure. The bias circuit 100 is configured to generate the bias voltage Vbias, in a manner which is adaptive to the input signal of the PA 100. This enables an increase of OP1dB and Psat compared with a constant bias.

According to the embodiment illustrated in FIG. 4, the bias circuit 200 comprises a first transistor M1 having its drain terminal and its gate terminal connected to a first circuit node, labeled x, and its source terminal connected to a first supply terminal, labeled GND. Furthermore, the bias circuit 200 comprises a first current source, labeled I1, connected to the node x. Moreover, the bias circuit comprises a first resistor R1 connected between the node x and a second circuit node, labeled y.

According to the embodiment illustrated in FIG. 4, the bias circuit 200 comprises a second transistor M2 configured to receive a first component RFinp of a differential input signal to the PA 100 at its gate terminal. M2 has its drain terminal connected to the node y and its source terminal connected to a second supply terminal, labeled VDD. Similarly, according to the embodiment illustrated in FIG. 4, the bias circuit 200 comprises a third transistor M3 configured to receive a second component RFinn of the differential input signal to the PA at its gate terminal. M3 also has its drain terminal connected to the node y and its source terminal connected to VDD. The gate terminals of M2 and M3 are configured to be biased by a first voltage V1. This can be accomplished in many different ways. In FIG. 4, V1 is supplied to the gate terminals of M2 and M3 via resistors R2 and R3, respectively. RFinp and RFinn are supplied to the gate terminals of M2 and M3, respectively, via capacitors C2 and C3, respectively.

Let RFin denote the differential signal whose components are RFinn and RFinp. RFin may be the same signal as PAin (FIG. 3). Hence, the capacitors C2 and C1 (FIG. 4) may be connected to the ends of the primary winding of the first transformer T1. In some embodiments RFin (FIG. 4) may be derived from PAin, e.g. via intervening circuit elements. In some embodiments, PAin may be derived from RFin, e.g. via intervening circuit elements. In some embodiments, PAin and RFin may both be derived from a common signal.

As indicated in FIG. 3, the bias circuit 200 may comprise a first capacitor C1 connected between the node x and the first supply terminal GND.

Furthermore, as indicated in FIG. 3, the bias circuit 200 is configured to generate the bias voltage Vbias at the node y.

As mentioned above, Vbias may be a bias voltage for gate terminals of input transistors, such as MCS1 and MCS2 (FIG. 3) of the PA 100.

As illustrated with measurement results below, the bias circuit 100 has a "knee-shaped" characteristic. Qualitatively speaking, for input magnitudes below a "knee", or threshold level, Vbias is approximately constant. For input magnitudes above the threshold level, Vbias increases approximately linearly with increasing input magnitude. For input magnitudes around the threshold level, there is a gradual increase of the slope of Vbias vs. input magnitude.

The location of the "knee", i.e. the threshold level, depends on the value of V1. According to some embodiments, V1 is digitally controllable. For instance, V1 may be generated by a DAC (not shown). This enables controlling the above-mentioned threshold level.

The slope of Vbias vs the input magnitude depends on the resistance of R1. In some embodiments, the resistance of the R1 is digitally controllable. This enables controlling said slope of Vbias vs the input magnitude.

Figure 5:
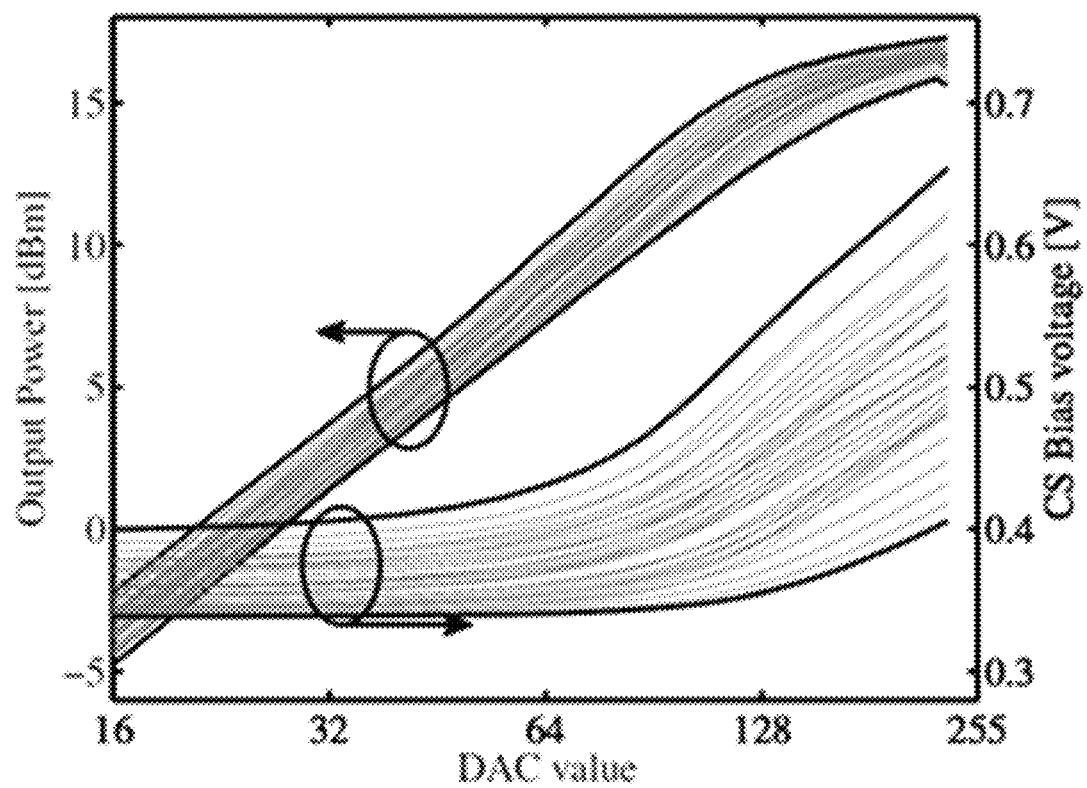
FIGS. 5-6 show measurement results.
Figure 6:
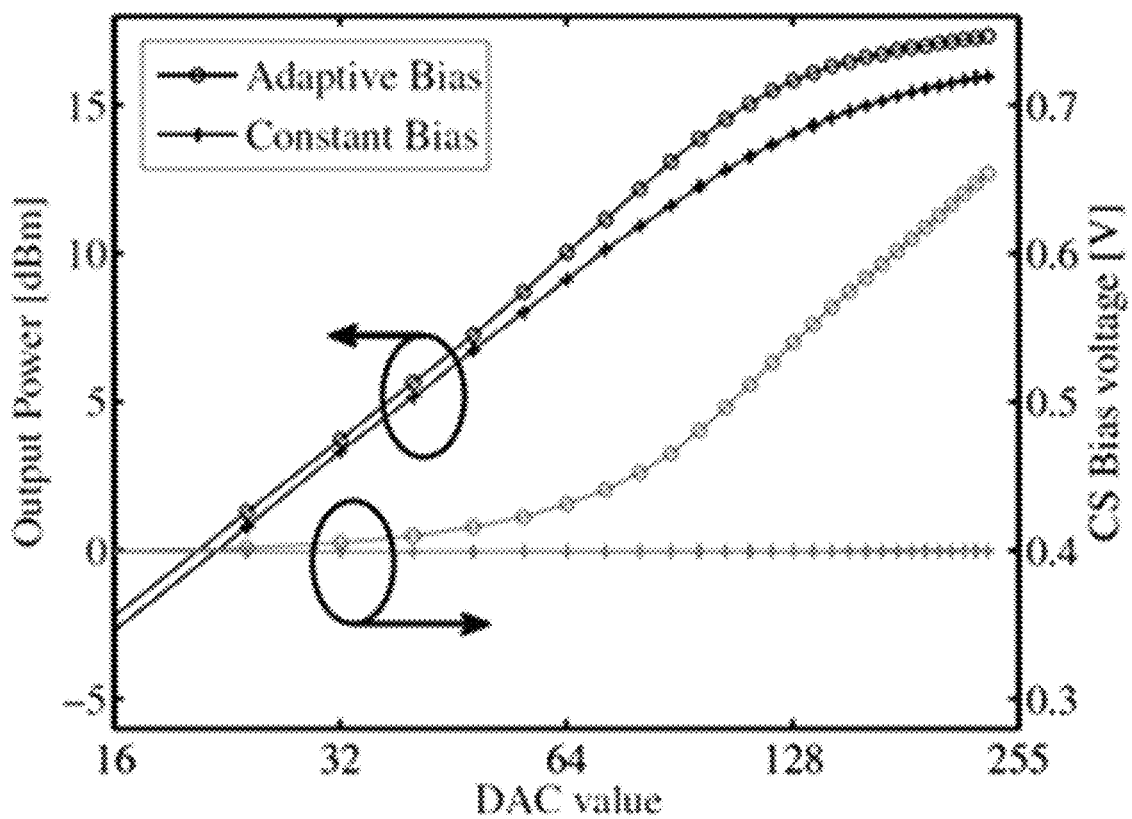

FIGS. 5 and 6 show measurement results from a particular implementation of a PA 100 of the type illustrated in FIG. 3 and a particular implementation of a bias circuit 200 of the type illustrated in FIG. 4 implemented in a 22 nm FD (Fully Depleted) SOI (Silicon-on-Insulator) CMOS (Complementary Metal Oxide Semiconductor) manufacturing process.

The PA 100 used in the measurements is designed to operate at input frequencies around 27 GHz. The voltage V1 is controllable via 3 bits, i.e. has 8 different possible levels. Similarly, the resistance of R1 is controllable via 3 bits, i.e. said resistance has 8 different possible values. In total, there are thus 8×8=64 different settings.

FIGS. 5 and 6 illustrate how the output power (left y-axis) and Vbias (right y-axis, called CS bias voltage in FIGS. 5 and 6) varies with the input magnitude (x-axis, labeled "DAC value" to indicate that it is the input signal level of the Tx DAC that generates the PA input).

FIG. 5 plots the output power and Vbias for all 64 different combinations of V1 and the resistance of R1. As can be seen, there is a range of different settings, which allows Vbias to be controlled such that it starts to increase at the input level (i.e. the above-mentioned threshold level) where the PA output stage starts to compress, and that it increases with a slope that compensates the gain compression at higher input signal levels. As described above, to a first approximation, the starting point (or threshold level) can be controlled by the voltage V1, effectively setting at which input amplitude the rectifying transistor pair M2 and M3 will start to conduct current. As also discussed above, the slope of the increase in Vbias can be set with the digitally controlled resistor R1, transforming the DC current from the transistor pair M2 and M3 into a DC voltage.

FIG. 6 compares the adaptive bias for a fixed setting of V1 and R1 with a case with a constant bias (i.e. a constant Vbias). As can be seen, by using the adaptive bias, an increase in both OP1dB and Psat can be obtained compared with when a constant bias voltage Vbias is used.

Figure 7:
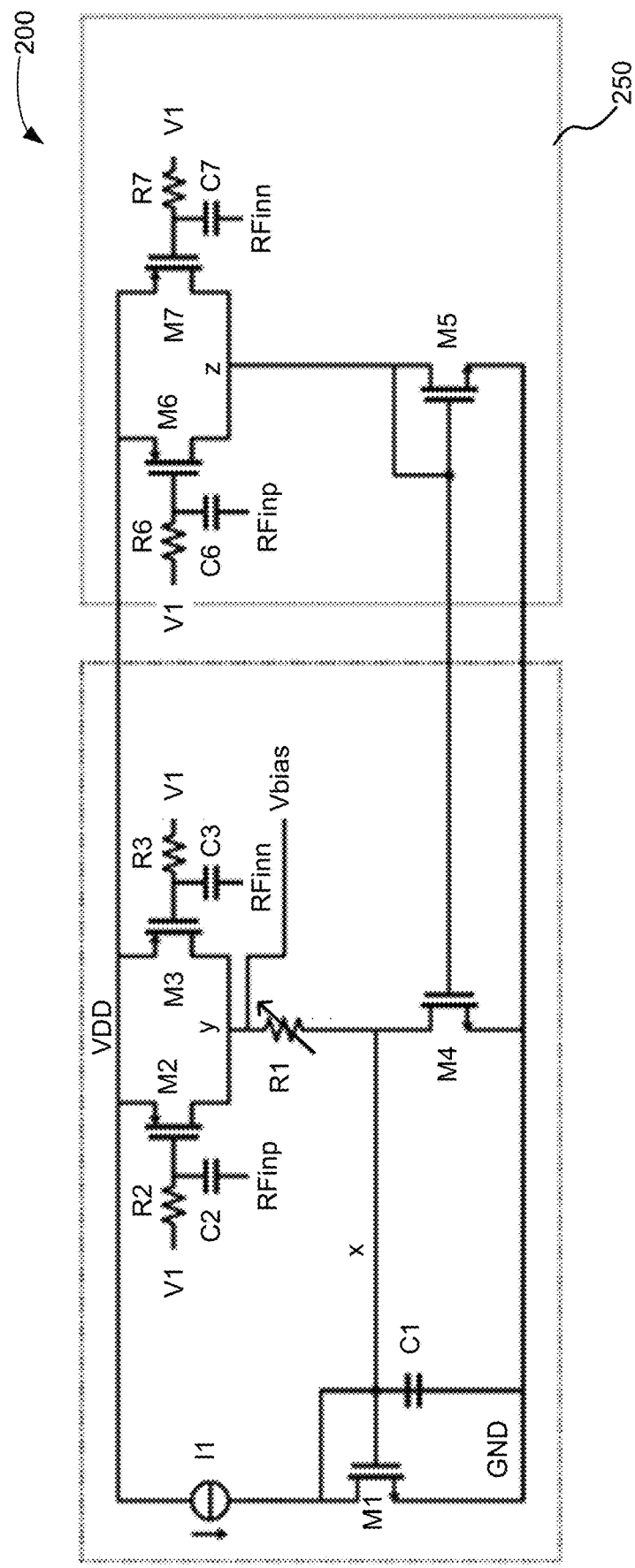
FIG. 7 is a schematic circuit diagram of a bias circuit.

When adjusting the two tuning parameters, i.e. the V1 and the resistance of R1, it may be desirable to control the threshold level and the slope of Vbias relatively independently. It may also be also desirable that the output impedance of the bias circuit 200 is relatively independent on the input magnitude, and that the voltage across the transistor M1 remains relatively constant at all input magnitudes to minimize the risk for memory effects. FIG. 7 illustrates an embodiment of the bias circuit 200 that has improved such properties in comparison with the embodiment illustrated in FIG. 4. In FIG. 7, the bias circuit 200 comprises a fourth transistor M4 having its gate terminal connected to a third circuit node z, its drain terminal connected to the first circuit node x, and its source terminal connected to the first supply terminal ("GND"). Qualitatively speaking, the transistor M4 can be used to subtract the signal-dependent current generated by M2 and M3 from the drain of M1, such that the drain current of M1 is relatively constant, independently of input magnitude. This can be obtained by the use of a "replica rectifier circuit" 250, whose output current is subtracted by a current mirror from the drain terminal of M1. M4 is the output side of that current mirror. Effectively the amplitude dependent current then flows in the programmable resistor R1, but not in the diode connected transistor M1, where ideally only the input reference current I1 will flow. The voltage across M1 will then remain relatively constant, and so will its impedance.

According to some embodiments, the bias circuit 200 thus comprises (in said replica rectifier circuit 250) a fifth transistor M5 having its drain terminal and its gate terminal connected to the node z and its source terminal connected to the first supply terminal ("GND"). M5 is the input side of the above-mentioned current mirror. Furthermore, the bias circuit 200 comprises (in said replica rectifier circuit 250) a sixth transistor M6 configured to receive the first component RFinp of the differential input signal to the PA at its gate terminal, having its drain terminal connected to the node z and its source terminal connected to the second supply terminal ("VDD"). Moreover, the bias circuit 200 comprises (in said replica rectifier circuit 250) a seventh transistor M7 configured to receive the second component RFinn of the differential input signal to the PA at its gate terminal, having its drain terminal connected to the node z and its source terminal connected to the second supply terminal ("VDD"). M6 and M7 mimics the operation of M2 and M3.

The gate terminals of M6 and M7 may be configured to be biased with V1, e.g. via resistors R6 and R7, respectively, as illustrated in FIG. 7. Furthermore, RFinp and RFinn may be supplied to the gate terminals of M6 and M7, respectively, via capacitors C6 and C7, respectively.

In the embodiments illustrated in the drawings, the second supply terminal ("VDD") is configured to be supplied with a higher electrical potential than the first supply terminal ("GND"). For instance, GND may correspond to an electrical potential of 0V, and VDD may correspond to a positive supply voltage level. Furthermore, M1, M4, and M5 are NMOS transistors. Moreover, M2, M3, M6, and M7 are PMOS transistors. These embodiments are suitable to generate the bias voltage Vbias for the PA 100 when the input transistors of the PA 100 (such as MCS1 and MCS2 in FIG. 3) are NMOS transistors.

In other embodiments, a complementary implementation can be used, where connections to GND and VDD are interchanged, and PMOS transistors are replaced with NMOS transistors, and vice versa. In such an embodiment, the second supply terminal would be configured to be supplied with a lower electrical potential than the first supply terminal. For instance, GND may still correspond to an electrical potential of 0V, and VDD may still correspond to a positive supply voltage level, but GND may be connected to the second supply terminal and VDD to the first supply terminal. Furthermore, in such embodiments M1, and where applicable, M4 and M5, would be PMOS transistors. Moreover, M2 and M3, and where applicable, M6 and M7 would be NMOS transistors. Such embodiments would be suitable to generate the bias voltage Vbias for the PA 100 in embodiments where the input transistors of the PA 100 are PMOS transistors. Such an embodiment of the PA 100 can e.g. be obtained as a complementary implementation of that in FIG. 3, by interchanging connections to GND and VDD, and by replacing NMOS transistors MCS1 and MCS2 (and MCG1 and MCG2) with PMOS transistors.

According to some embodiments, there is provided a PA circuit comprising an embodiment of the bias circuit 200 and a PA, such as an embodiment of the PA 100, configured to be biased with said bias voltage Vbias.

Embodiments of the PA circuit, including the bias circuit 200 and the PA, are suitable for integration (either fully or in part) on an integrated circuit. Thus, according to some embodiments, there is provided an integrated circuit comprising the PA circuit.

The PA circuit may be comprised in an electronic apparatus. The electronic apparatus may e.g. be a communication apparatus, such as the wireless communication device 1 or base station 2 (FIG. 1). For instance, the PA circuit may be included in the TxFE circuit 30 of the transceiver circuit 10 (FIG. 2). The transceiver circuit 10 may in turn be included in the electronic apparatus.

Embodiments of the adaptive bias circuit 200 are designed to track an envelope of the input signal to the PA. This is advantageous compared with tracking the output signal amplitude. One reason is that tracking the output signal would result in a loop, with potential instability. The loop is formed since the output signal amplitude depends on the bias, which is controlled by the output signal amplitude. Tracking the input amplitude avoids that issue. Another problem of tracking the output signal is that when the amplifier starts to saturate, and the bias voltage needs to increase more rapidly to compensate, the output signal amplitude increases more slowly with input, so in contrast to what is needed, a less effective bias voltage steepness may be obtained.

The disclosure above refers to specific embodiments. However, other embodiments than the above described are possible. For example, the PA circuit may be used in other types of electronic apparatuses than communication apparatuses. The different features of the embodiments may be combined in other combinations than those described.

The invention claimed is:

1. A bias circuit for a power amplifier, PA, the bias circuit comprising:
    a first transistor having its drain terminal and its gate terminal connected to a first circuit node and its source terminal connected to a first supply terminal;
    a first current source connected to the first circuit node;
    a digitally controllable first resistor connected between the first circuit node and a second circuit node;
    a second transistor configured to receive a first component of a differential input signal to the PA at its gate terminal, having its drain terminal connected to the second circuit node and its source terminal connected to a second supply terminal;
    a third transistor configured to receive a second component of the differential input signal to the PA at its gate terminal, having its drain terminal connected to the second circuit node and its source terminal connected to a second supply terminal;
    the gate terminals of the second transistor and the third transistor biased by a digitally controllable first voltage; and
    the bias circuit configured to generate a bias voltage for the PA at the second circuit node.

2. The bias circuit of claim 1, the bias voltage for the PA operative as a bias voltage for gate terminals of input transistors of the PA.

3. The bias circuit of claim 1, further comprising a first capacitor connected between the first circuit node and the first supply terminal.

4. The bias circuit of claim 1, further comprising a fourth transistor having its gate terminal connected to a third circuit node, its drain terminal connected to the first circuit node, and its source terminal connected to the first supply terminal.

5. The bias circuit of claim 4, further comprising a fifth transistor having its drain terminal and its gate terminal connected to the third circuit node and its source terminal connected to the first supply terminal.

6. The bias circuit of claim 5, further comprising a sixth transistor configured to receive the first component of a differential input signal to the PA at its gate terminal, having its drain terminal connected to the third circuit node and its source terminal connected to the second supply terminal.

7. The bias circuit of claim 6, further comprising a seventh transistor configured to receive the second component of the differential input signal to the PA at its gate terminal, having its drain terminal connected to the third circuit node and its source terminal connected to the second supply terminal.

8. The bias circuit of claim 7, further comprising gate terminals of the sixth transistor and the seventh transistor biased by the first voltage.

9. The bias circuit of claim 1, the second supply terminal supplied with a higher electrical potential than the first supply terminal;
the first transistor is an NMOS transistor; and
the second transistor and the third transistor are PMOS transistors.

10. The bias circuit of claim 1, the second supply terminal supplied with a lower electrical potential than the first supply terminal;
the first transistor is a PMOS transistor; and
the second transistor and the third transistor are NMOS transistors.

11. A PA circuit comprising:
a bias circuit, the bias circuit comprising:
a first current source connected to the first circuit node;
a digitally controllable first resistor connected between the first circuit node and a second circuit node;
a second transistor configured to receive a first component of a differential input signal to the PA at its gate terminal, having its drain terminal connected to the second circuit node and its source terminal connected to a second supply terminal;
a third transistor configured to receive a second component of the differential input signal to the PA at its gate terminal, having its drain terminal connected to the second circuit node and its source terminal connected to a second supply terminal;
the gate terminals of the second transistor and the third transistor biased by a digitally controllable first voltage; and
the bias circuit configured to generate a bias voltage for the PA at the second circuit node.

12. The PA circuit of claim 11, further comprising an input stage of common source type, wherein input transistors of the input stage are configured to be biased with the bias voltage at their gate terminals.

13. The PA circuit of claim 12, further comprising a first transformer configured to receive the input signal of the PA across a primary winding, having a secondary winding connected between the gate terminals of the input transistors of the input stage, and configured to receive the bias voltage at a center tap of the secondary winding.

14. The PA circuit of claim 11, comprised in an integrated circuit.

15. An electronic apparatus comprising a PA circuit, the PA circuit comprising a bias circuit, the bias circuit comprising:
a first transistor having its drain terminal and its gate terminal connected to a first circuit node and its source terminal connected to a first supply terminal;
a first current source connected to the first circuit node;
a digitally controllable first resistor connected between the first circuit node and a second circuit node;
a second transistor configured to receive a first component of a differential input signal to the PA at its gate terminal, having its drain terminal connected to the second circuit node and its source terminal connected to a second supply terminal;
a third transistor configured to receive a second component of the differential input signal to the PA at its gate terminal, having its drain terminal connected to the second circuit node and its source terminal connected to a second supply terminal;
the gate terminals of the second transistor and the third transistor biased by a digitally controllable first voltage; and
the bias circuit configured to generate a bias voltage for the PA at the second circuit node.

16. The electronic apparatus of claim 15, operative as a communication apparatus.

17. The electronic apparatus of claim 16, operative as a wireless communication device for a cellular communications system.

18. The electronic apparatus of claim 16, operative as a base station for a cellular communications system.

19. The electronic apparatus of claim 15, the bias circuit further comprising a fourth transistor having its gate terminal connected to a third circuit node, its drain terminal connected to the first circuit node, and its source terminal connected to the first supply terminal.

20. The electronic apparatus of claim 19, the bias circuit further comprising a fifth transistor having its drain terminal and its gate terminal connected to the third circuit node and its source terminal connected to the first supply terminal.

21. The electronic apparatus of claim 20, the bias circuit further comprising a sixth transistor configured to receive the first component of a differential input signal to the PA at its gate terminal, having its drain terminal connected to the third circuit node and its source terminal connected to the second supply terminal.

22. The electronic apparatus of claim 21, the bias circuit further comprising a seventh transistor configured to receive the second component of the differential input signal to the PA at its gate terminal, having its drain terminal connected to the third circuit node and its source terminal connected to the second supply terminal.

23. The electronic apparatus of claim 22, the bias circuit further comprising gate terminals of the sixth transistor and the seventh transistor biased by the first voltage.

* * * * *